(12) United States Patent
Ames

(10) Patent No.: US 9,110,129 B1
(45) Date of Patent: Aug. 18, 2015

(54) TEST FIXTURE UTILIZING A DOCKING STATION AND INTERCHANGEABLE CASSETTES AND METHOD OF USE

(71) Applicant: Michael Ames, Pompano Beach, FL (US)

(72) Inventor: Michael Ames, Pompano Beach, FL (US)

( * ) Notice: Subject to any disclaimer, the term of this patent is extended or adjusted under 35 U.S.C. 154(b) by 24 days.

(21) Appl. No.: 14/159,384

(22) Filed: Jan. 20, 2014

Related U.S. Application Data

(63) Continuation-in-part of application No. 13/297,238, filed on Nov. 15, 2011, now Pat. No. 8,633,721.

(60) Provisional application No. 61/414,763, filed on Nov. 17, 2010.

(51) Int. Cl.
| | |
|---|---|
| G01R 31/20 | (2006.01) |
| G01R 31/00 | (2006.01) |
| G01R 31/28 | (2006.01) |
| G01R 1/073 | (2006.01) |
| G01R 31/04 | (2006.01) |

(52) U.S. Cl.
CPC ........ *G01R 31/2808* (2013.01); *G01R 1/07328* (2013.01); *G01R 31/2801* (2013.01); *G01R 31/043* (2013.01)

(58) Field of Classification Search
CPC .... G01R 31/04; G01R 31/043; G01R 31/046; G01R 31/26; G01R 31/2801; G01R 31/2808; G01R 31/2817; G01R 31/2851; G01R 31/2853; G01R 31/2886; G01R 31/2896; G01R 31/309; G01R 31/317; G01R 1/07328
USPC ............. 324/750.25, 750.16, 754.01, 754.03, 324/754.07, 754.1, 754.11, 755.01, 756.03, 324/500, 537, 690, 696, 715, 724, 72.5
See application file for complete search history.

(56) References Cited

U.S. PATENT DOCUMENTS

| | | | | |
|---|---|---|---|---|
| 4,724,383 | A * | 2/1988 | Hart | 324/750.25 |
| 4,774,462 | A * | 9/1988 | Black | 324/756.04 |
| 5,555,422 | A | 9/1996 | Nakano | |
| 5,633,598 | A * | 5/1997 | Van Loan et al. | 324/754.08 |
| 5,945,838 | A * | 8/1999 | Gallagher et al. | 324/750.25 |
| 6,194,908 | B1 * | 2/2001 | Wheel et al. | 324/756.04 |
| 8,237,461 | B2 | 8/2012 | Kitazume et al. | |
| 8,269,507 | B2 * | 9/2012 | Hall | 324/538 |
| 2012/0068725 | A1 | 3/2012 | Pagani | |
| 2012/0139572 | A1 | 6/2012 | Kim | |
| 2015/0061713 | A1 * | 3/2015 | Shia et al. | 324/750.16 |

* cited by examiner

*Primary Examiner* — Hoai-An D Ngueyn
(74) *Attorney, Agent, or Firm* — Allen D. Hertz, P.A.; Allen D. Hertz

(57) ABSTRACT

An automated electronics circuit test cassette assembly is provided for mating with a test platform. The platform comprises a platform common signal interface and a vacuum manifold having a combined registration and vacuum port coupler. The cassette assembly includes a cassette common signal interface providing electrical communication with the platform common signal interface and an alignment bushing providing combined registration and vacuum communication with the vacuum port coupler. A pattern of test probes mimic a test pattern on a printed circuit assembly (PCA), extending upwards from a probe support substrate and optionally downward from a clamshell probe substrate. The PCA is supported by a PCA support substrate floating above the test probe support substrate. The clamshell test substrate provides a vacuum seal above the PCA support substrate. Testing is completed by applying a vacuum, which draws the probes against the PCA, and applying testing signals through electrical connections created therebetween.

20 Claims, 12 Drawing Sheets

TEST FIXTURE UTILIZING A DOCKING STATION AND INTERCHANGEABLE CASSETTES AND METHOD OF USE

CROSS-REFERENCE TO RELATED APPLICATION

This Application is a Divisional Application claiming the benefit of Non-Provisional Utility application Ser. No. 13/297,238, filed on Nov. 15, 2011 (scheduled to issue as U.S. Pat. No. 8,633,721 on Jan. 21, 2014), which claims the benefit of U.S. Provisional Patent Application Ser. No. 61/414,763, filed on Nov. 17, 2010, which is incorporated herein in its entirety.

FIELD OF THE INVENTION

The present invention relates to an automated electronics circuit test device, and more particularly, an automated electronics circuit test device utilizing an interchangeable cassette assembly that removably engages with a test platform.

BACKGROUND OF THE INVENTION

The invention pertains to an automated electronics circuit test cassette assembly for removably mating with a test platform.

Automated test equipment (ATE) is commonly used in the electronics assembly process. The ATE includes a large test assembly that is placed upon a test stand. The large test fixture is dedicated to a specific test equipment manufacturer. The test fixture is heavy, bulky, and expensive to fabricate. The test frame and primary components are designed and sold by the specific test equipment manufacturer. This dictates that the assembly process utilize a test platform from the associated test equipment manufacturer or invest in a second test fixture.

The test fixtures are generally 30-36 inches across, 5-9 inches tall, and 18-26 inches deep. The text fixtures can weight between 30 and 65 pounds. The size and weight of the test fixtures makes it difficult for one person to transport and install into the test equipment. Additionally, the size and weight of the test fixtures makes it difficult to store, as they require a large storage area and are normally not stored above a reasonable lifting height.

The test fixture frame, vacuum plumbing, and basic support wiring is offered in an assembly from the specific test equipment manufacturer. This subassembly is expensive.

Accordingly, there remains a need in the art for a device that provides an apparatus and respective method, which reduces the storage requirements, overall fixture costs, the overall fixture weight, and the like to aid in the usability, storage, set-up and breakdown of the test equipment.

SUMMARY OF THE INVENTION

The present invention overcomes the deficiencies of the known art and the problems that remain unsolved by providing an apparatus and a respective method for testing electronic assemblies, the test platform utilizing a removable cassette to reduce costs, weight, materials, and storage requirements.

In accordance with one embodiment of the present invention, the invention consists of an automated electronics circuit test cassette assembly for mating with a test platform, the cassette assembly comprising:

a test probe support substrate;

a plurality of test probes is arranged in a predetermined test pattern to mate with and test a target electronics assembly, the test probes being assembled to the test probe support substrate;

a common interface test probe set is provided in signal communication with the plurality of test probes for mating with and providing signal communication to a plurality of common interface test probe contacts of the test platform;

at least two cassette alignment bushings attached to the test probe support substrate, the cassette alignment bushings comprising a registration receptacle extending inward from a mating edge thereof, and a vacuum port passing therethrough, the cassette alignment bushings being positioned to align and mate with a registration and vacuum supply coupler extending from a vacuum supply manifold of the test platform providing a vacuum passage between the vacuum supply manifold and an upper surface of the test probe support substrate;

a printed circuit assembly test support member having a series of test probe apertures, the test probe apertures having a pattern mimicking the predetermined pin test pattern; and a vacuum seal provided between the test probe support substrate and the printed circuit assembly test support member.

In one aspect, the automated electronics circuit test cassette assembly further comprises a clamshell test head assembly, the clamshell test assembly comprising:

a clamshell test substrate; and a vacuum seal provided about a periphery of a mating surface of the clamshell test substrate.

Yet another aspect, the clamshell test assembly further comprises a registration interface, the registration interface providing alignment between the clamshell test assembly and the test probe support substrate.

While another aspect, the registration interface is a hinged assembly.

With yet another aspect, the registration interface is a plurality of registration pins that mate with a plurality of registration receptacle, respectively.

In another aspect, the clamshell test support substrate is assembled to a clamshell test frame.

With another aspect, the clamshell test support substrate is assembled to a clamshell test frame using a plurality of vertically biased sliding members, the vertically biased sliding members providing a vertical motion to the clamshell test support substrate.

Yet another aspect, the clamshell test assembly further comprises a pattern of test probes extending downward from the clamshell test support substrate, the test probes being in electrical communication with a series of extended clamshell test signal contacts.

Regarding another aspect, a clamshell signal adapter provides electrical communication between a series of base clamshell test signal contacts provided upon an upper surface of the test probe support substrate and the extended clamshell test signal contacts.

In yet another aspect, the clamshell signal adapter is fabricated having a plurality of dual sided compression test probes assembled to a signal adapter body, wherein a first end of the double ended probe forms a base interface contact and a second end of the double ended probe end forms a clamshell interface contact.

While another aspect, the test probe support substrate further comprises a plurality of biasing support members provided to separate the printed circuit assembly test support member from the upper surface of the test probe support substrate.

With yet another aspect, the test probe support substrate further comprises a plurality of vacuum draw stops provided to maintain a minimal distance between a bottom surface of the printed circuit assembly test support member and the upper surface of the test probe support substrate.

Yet another aspect, the automated test cassette further comprises a removal assistance tab extending from an edge thereof.

Regarding another aspect, the printed circuit assembly test support member further comprises a Printed Circuit assembly registration interface.

In yet another aspect, the printed circuit assembly registration interface comprises at least one printed circuit assembly registration pin.

While another aspect, the test fixture further comprises a two-stage test controlling mechanism.

With yet another aspect, the two-stage test controlling mechanism comprising a two-stage test platform support vertical member extending from a lower surface of the printed circuit assembly test support member and in registration with a two-stage test platform support member clearance provided through the enclosure pivotal cover of the test chassis, wherein the two-stage test platform support vertical member is of a length that supports the printed circuit assembly test support member at a first stage test level when a two-stage test platform configuration member is positioned at least partially blocking the two-stage test platform support member clearance.

These and other aspects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, in which.

Like reference numerals refer to like parts throughout the several views of the drawings.

DETAILED DESCRIPTION

Detailed embodiments of the present invention are disclosed herein. It will be understood that the disclosed embodiments are merely exemplary of the invention that may be embodied in various and alternative forms. The figures are not necessarily to scale, and some features may be exaggerated or minimized to show details of particular embodiments, features, or elements. Specific structural and functional details, dimensions, or shapes disclosed herein are not limiting but serve as a basis for the claims and for teaching a person of ordinary skill in the art the described and claimed features of embodiments of the present invention. The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

Figure 1:
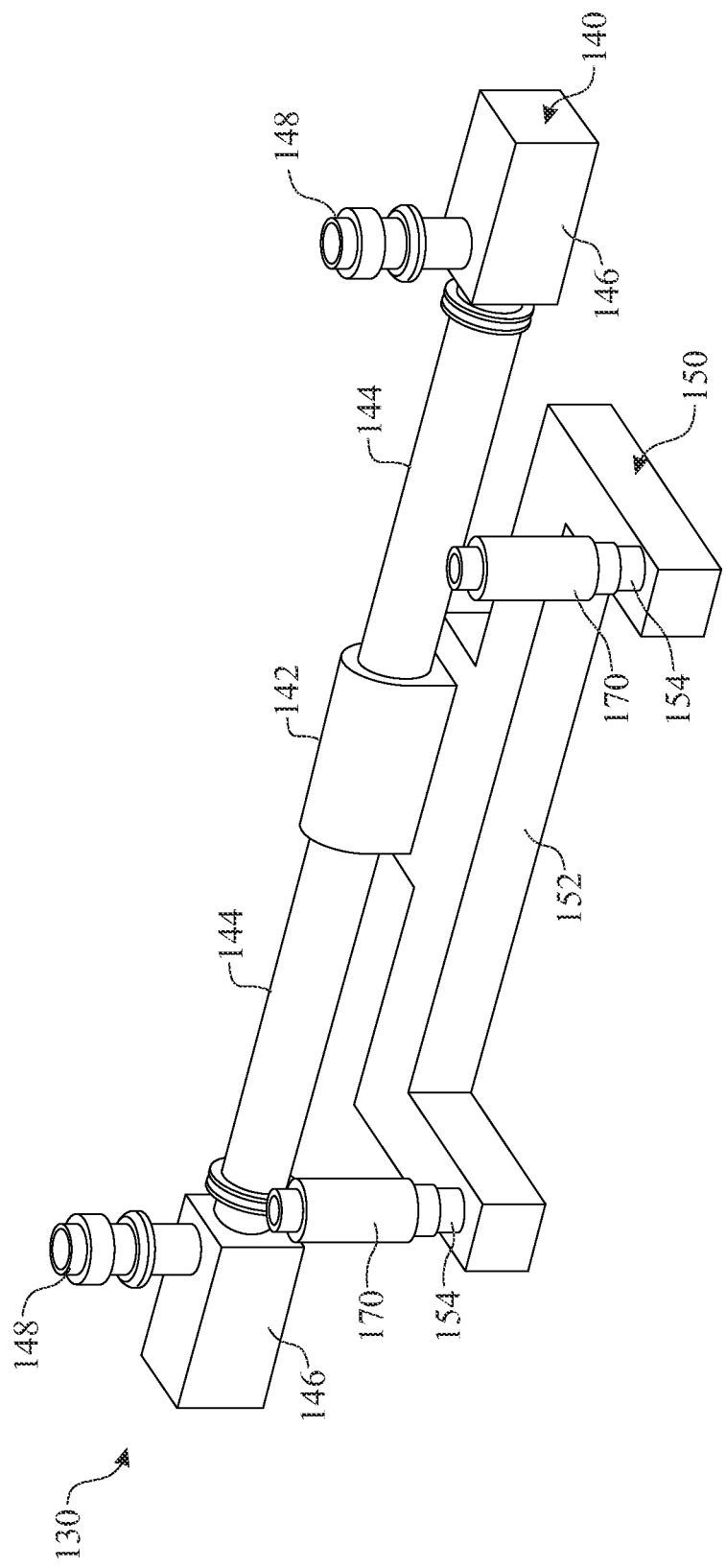
FIG. 1 presents an isometric view of an exemplary vacuum distribution manifold assembly which is integrated into an automated test equipment chassis.

For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 9:
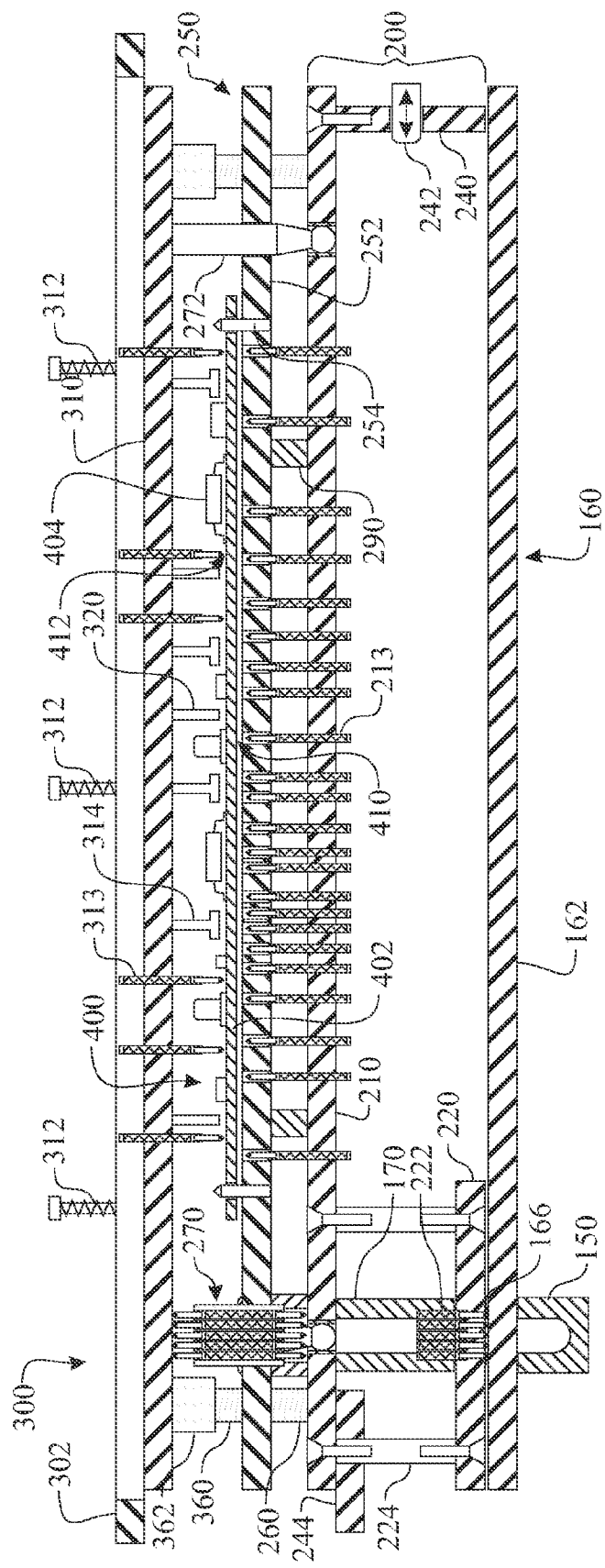
FIG. 9 presents a sectional elevation view of the automated electronics circuit test system taken along a longitudinal section perpendicular to the rear registration components, wherein the system illustrated is in an inactive state.
Figure 10:
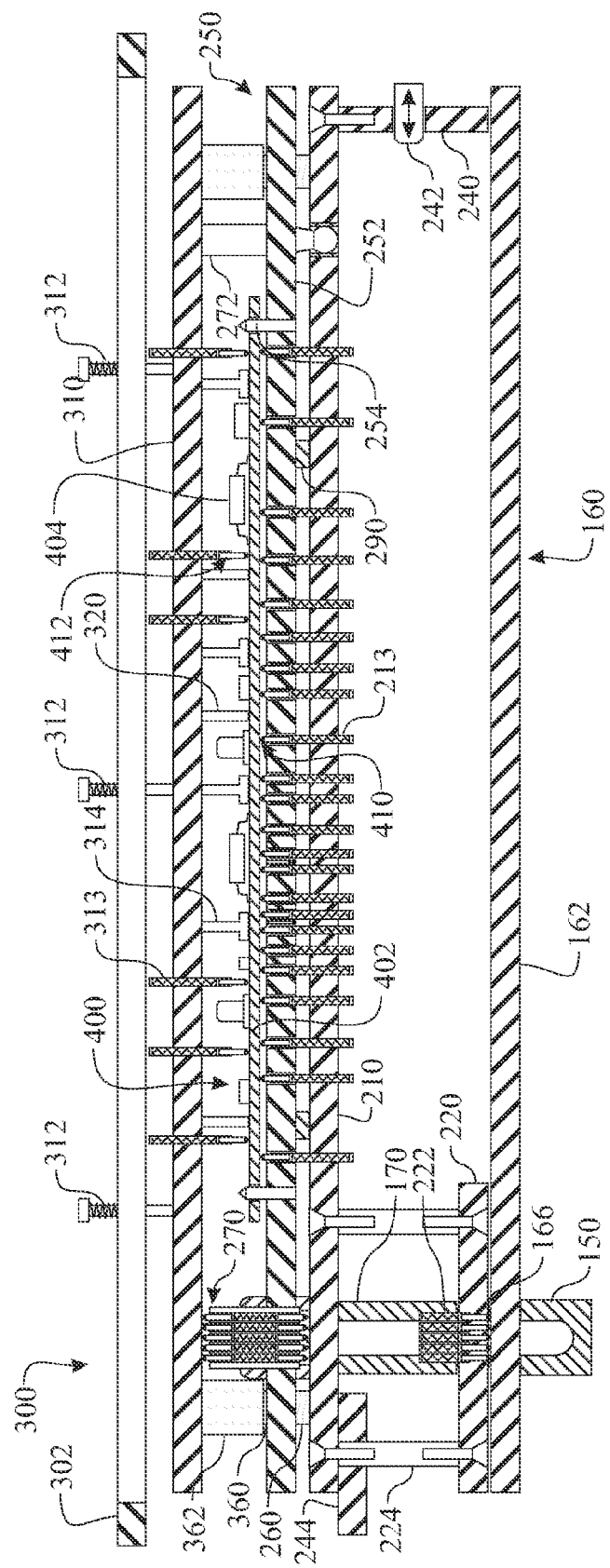
FIG. 10 presents a sectional elevation view of the automated electronics circuit test system of FIG. 9, wherein the system is illustrated in an active, testing state.
Figure 11:
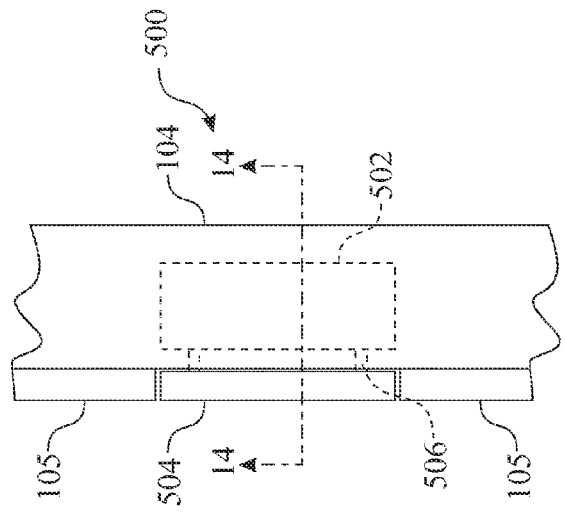
FIG. 11 presents a top view illustrating the exemplary two stage test control mechanism, wherein the mechanism is illustrated in a partial test, first stage configuration.

The present invention is directed towards an improvement in equipment used for testing a printed circuit assembly 400 (FIGS. 9 and 10). The printed circuit assembly 400 is fabricated assembling a plurality of electronic components 404 onto a printed circuit board 402. The present invention utilizes an automated test cassette 200 in conjunction with an automated test equipment platform 100, which provides the end user with a device having several advantages over the existing technology as shown throughout the figures. The use of a removably insertable automated test cassette 200 reduces the cost of the test fixture, reduces the weight of the entire test fixture, and reduces the storage size of the test fixture.

The automated test equipment platform 100 integrates functional utility supply elements into an automated test equipment chassis 102, wherein the functional utility supply elements include a vacuum distribution manifold assembly 130 and a common interface test probe contact base interface assembly 160 disposed within a platform enclosure interior 106. The vacuum distribution manifold assembly 130 provides a vacuum conduit from a vacuum source (such as a vacuum motor) and the common interface test probe contact base interface assembly 160 provides an electrical power and signal interface from an electrical test control circuit. The vacuum distribution manifold assembly 130 is defined having two sections, a vacuum source manifold assembly 140 and a vacuum supply manifold assembly 150, as detailed in FIG. 1. The vacuum source manifold assembly 140 controls and distributes a source vacuum flow, wherein the source vacuum flow is introduced through at least one vacuum source interface 148 and controlled by a vacuum control solenoid 146. The vacuum flow continues through a vacuum source conduit 144 and into a vacuum transfer member 142, where the vacuum flow transitions from the vacuum source manifold assembly 140 to the vacuum supply manifold assembly 150. A vacuum supply manifold 152 provides fluid communication of the vacuum flow between the vacuum transfer member 142 and at least one registration and vacuum supply coupler 154. It is understood that a plurality of registration and vacuum supply couplers 154 are desired, as illustrated in the exemplary embodiment illustrated in FIG. 1 and throughout the figures. A cassette alignment bushing 170 removably engages with the registration and vacuum supply coupler 154. The additional functions provided by the cassette alignment bushing 170 will be detailed further in this disclosure.

Additional elements integrated into the automated test equipment platform 100 include an access panel 103, a pair of chassis mounting rails 112, and a lid prop member 110. The access panel 103 provides access to the platform enclosure interior 106 from a respective side of the automated test equipment enclosure 102. The access panel 103 can include a user interface for controlling the pneumatics, the electrical testing, and the like. The user interface can be switches, a touch screen, and the like. A pair of chassis mounting rails 112 are assembled to the automated test equipment enclosure 102 providing a means for transporting and mounting the automated test equipment enclosure 102 as needed. The platform cassette receiving chassis member 104 is hingeably attached to the automated test equipment enclosure 102. A lid prop member 110 can be integrated into the automated test equipment enclosure 102 to maintain the platform cassette receiving chassis member 104 in a raised position. The lid prop member 110 can be any form factor, where the preferred embodiment is a rotating support arm.

Figure 2:
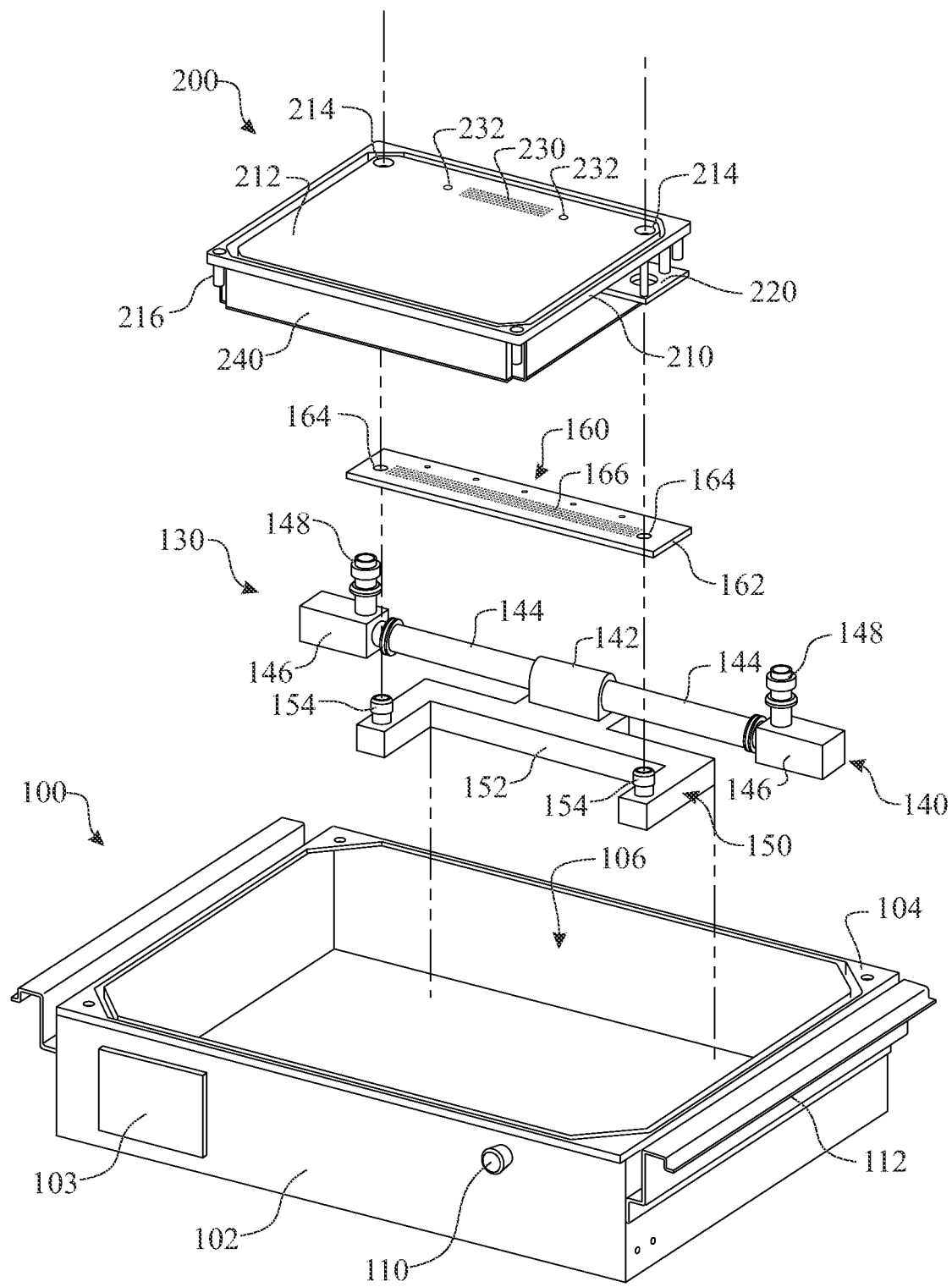
FIG. 2 presents an isometric exploded assembly view of an exemplary automated test cassette and primary components of the automated test equipment chassis.

The common interface test probe contact base interface assembly 160 provides a first portion of an electrical power and signal communication interface between the automated test equipment platform 100 and the automated test cassette 200. Details of the common interface test probe contact base interface assembly 160 are presented in FIG. 2 with the common interface test probe contact base interface assembly 160 shown assembled into the automated test equipment chassis 102 in FIG. 3. In the exemplary embodiment, the common interface test probe contact base interface assembly 160 is assembled to and located by the registration and vacuum supply coupler 154 via a respective number of substrate assembly apertures 164. It is understood that the common interface test probe contact base interface assembly 160 can be assembled to any location within the automated test equipment chassis 102, wherein the common interface test probe contact base interface assembly 160 maintains a registration for properly engaging with a common interface test probe contact conveyance substrate 220 of the automated test cassette 200 as illustrated in FIGS. 7 through 10. A series of common interface test probe contacts 166 are disposed upon a contact surface of the common interface test probe contact base interface assembly 160 for electrical engagement with a respective common interface test probe set 222. The common interface test probe contacts 166 can be contact points on a printed circuit board, test probe heads, and the like. Each of the common interface test probe contacts 166 are in signal communication with a test control circuit using either a printed circuit board, wires, a combination thereof, and the like.

The automated test cassette 200 utilizes a test probe support substrate 210 as a primary support member. The test probe support substrate 210 is of a size and shape to adapt to an opening in the platform cassette receiving chassis member 104 of the automated test equipment platform 100. A plurality of registration pins 216 can extend downward from the test probe support substrate 210, with the exemplary embodiment positioning each registration pin 216 adjacent to a respective corner. A test probe support substrate surface 212 is provided as an upper surface or testing surface of the test probe support substrate 210. In the exemplary embodiment, the test probe support substrate surface 212 is fabricated of a ⅜" thick piece of glass reinforced phenalic.

Figure 4:
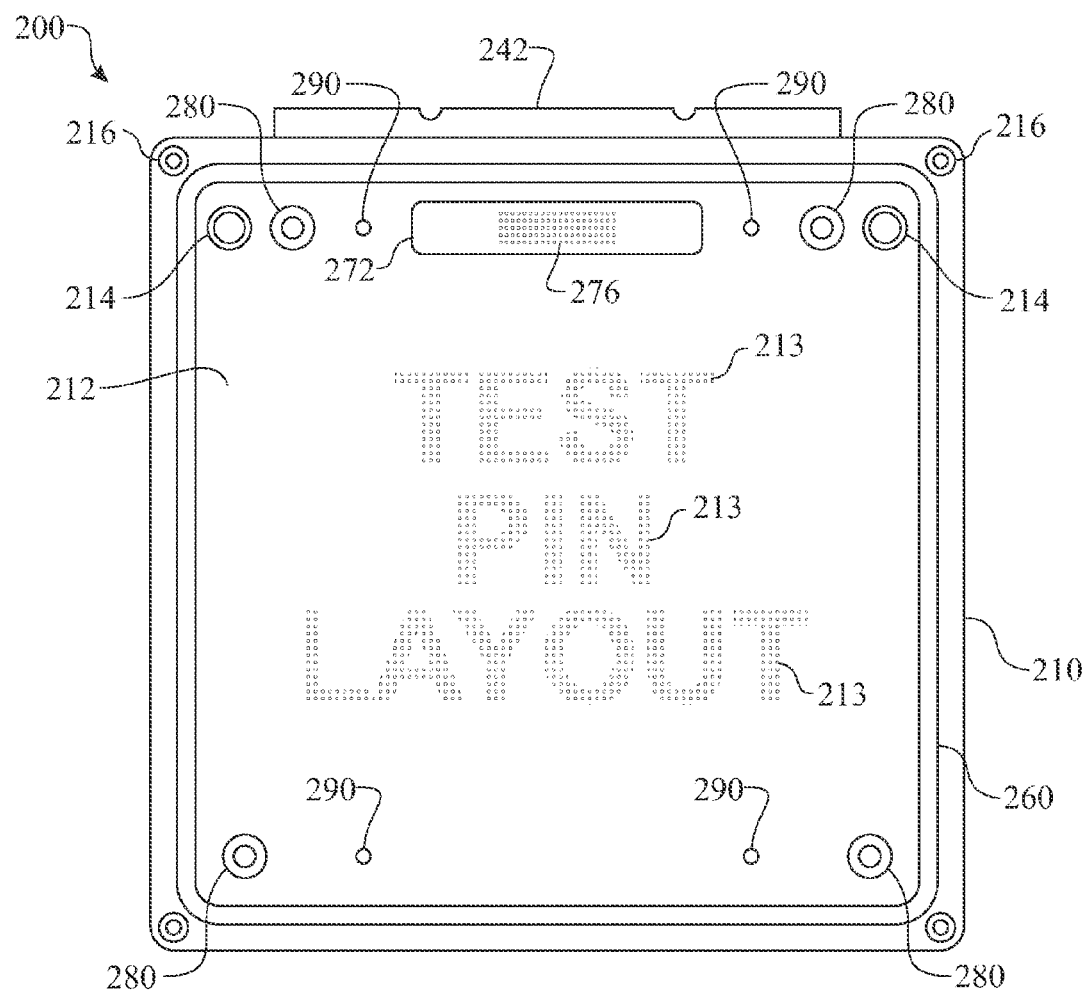
FIG. 4 presents a top plan view of the exemplary automated test cassette.
Figure 5:
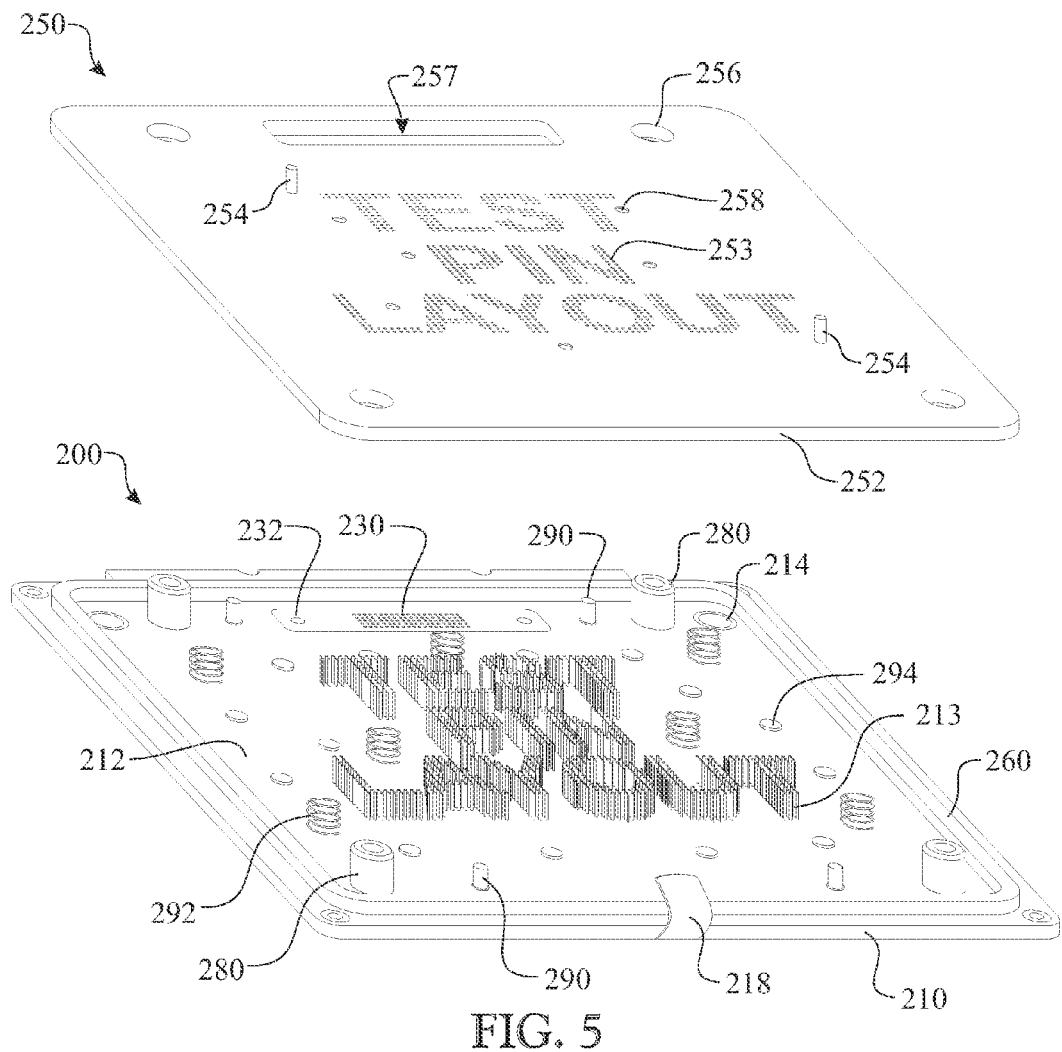
FIG. 5 presents an isometric view of a test pin portion of the exemplary automated test cassette.
Figure 6:
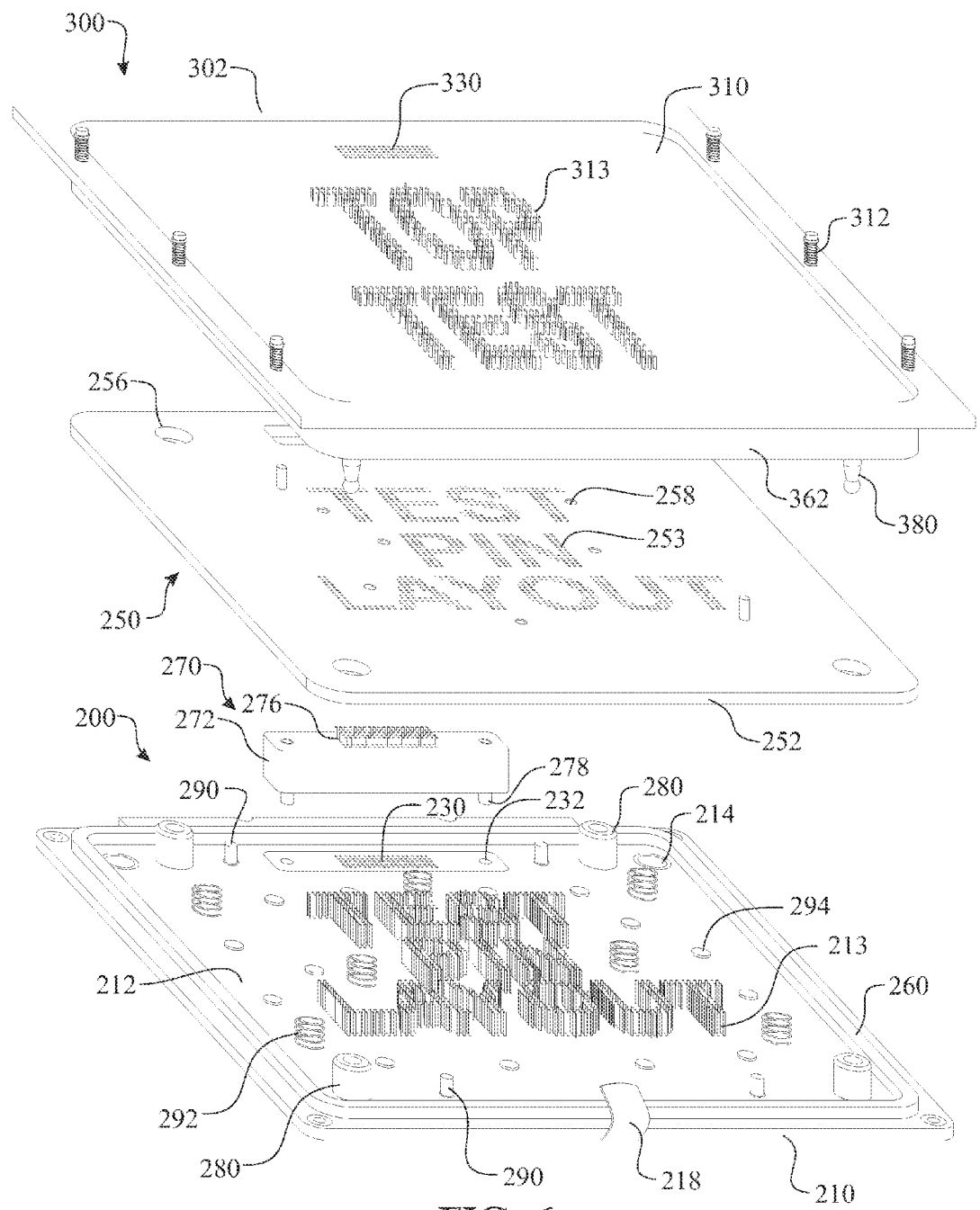
FIG. 6 presents an isometric view of the test pin portion of the exemplary automated test cassette of FIG. 5, introducing an upper seal member having integrated test probes.

A test probe support substrate 210 is configured for testing a specific printed circuit assembly by drilling a pattern of a series of apertures for receiving an automated test probe layout 213 as illustrated in FIGS. 4 through 6. The pattern mimics a test pattern of PCB bottom side test points 410 applied to a lower surface of the printed circuit assembly. The test probes 213 can be selected from a variety of form factors, spring rates, compression distance, and the like. The specific form factor of each test probe 213 is determined for each individual test location. The test probes 213 are forcibly inserted into each respective drilled hole. Each test probe can include a feature to ensure the test probe 213 is positioned having a consistent height. At least one vacuum transfer aperture 214 is provided through the test probe support substrate surface 212 providing a means for passing the vacuum flow through the test probe support substrate surface 212. A vacuum seal 260 is adhered proximate a perimeter of the test probe support substrate 210. The vacuum seal 260 provides a vacuum gasket between the test probe support substrate 210 and a printed circuit assembly test support member 250.

Additional elements are assembled to the test probe support substrate 210 as best illustrated in FIG. 6. A series of return spring members in any form factor, such as a spring loaded support member 290 and/or a spring support member 292, are assembled to the test probe support substrate surface 212.

A common interface test probe contact conveyance substrate 220 is assembled to the test probe support substrate 210, the common interface test probe contact conveyance substrate 220 being located in registration with the common interface test probe contact base interface assembly 160. The common interface test probe contact conveyance substrate 220 can be rigidly attached to the test probe support substrate 210 using a plurality of common interface substrate mounts 224. A series of common interface test probe set 222 are assembled to the common interface test probe contact conveyance substrate 220 as illustrated in FIGS. 7 through 10. The common interface test probe set 222 is arranged in a pattern emulating the pattern of the common interface test probe contacts 166. Each probe of the common interface test probe set 222 provides electrical communication with the respective common interface test probe contact 166. Each test probe 213 is in signal communication with a respective common interface test probe set 222 a printed circuit board, wires, a combination thereof, and the like. The preferred embodiment utilizes a wire wrapping process. The exemplary spring loaded support member 290 is a biased sliding pin. The exemplary spring support member 292 is a coiled spring. As illustrated, the moveable element of the probes 213 extend upward from the test probe support substrate surface 212 and are biased allowing the probe section to retract at least to the test probe support substrate surface 212. A plurality of vacuum draw stops 294 is assembled to the test probe support substrate surface 212 to support and maintain the printed circuit assembly test support member 250 at a consistent distance when the vacuum force is applied to the test fixture. The vacuum draw stops 294 can be fabricated of any vertically rigid material, such as a small phenalic disc. At least two clamshell pin registration receptacles 280 are assembled to the test probe support substrate 210 for alignment of the printed circuit assembly test support member 250 and a clamshell test head assembly 300. A removal assistance tab 218 can be attached to at least one edge of the test probe support substrate 210 for aiding the user in removal of the automated test cassette 200 from the automated test equipment platform 100. The removal assistance tab 218 provides the user with a member which the user can grip and apply a lifting force to separate the automated test cassette 200 from the automated test equipment platform 100.

A vertical support member 240 extends downward from the test probe support substrate 210 proximate a front edge to provide a supporting edge that is planar to the common interface test probe contact conveyance substrate 220. The vertical support member 240 can be assembled to the test probe support substrate 210 using mechanical fasteners (as illustrated), adhesives, and the like, or any combination thereof. The vertical support member 240 is preferably fabricated of the same material of the test probe support substrate 210.

A series of base clamshell test signal contacts 230 can be integrated into the test probe support substrate 210 providing signal communication with a clamshell test member. Each of the base clamshell test signal contacts 230 is in signal communication with a respective common interface test probe set 222 a printed circuit board, wires, a combination thereof, and the like. The base clamshell test signal contacts 230 can be contact points on a printed circuit board, test probe heads, and the like. At least two clamshell interface registration apertures 232, or similar features, are provided for ensuring registration between a plurality of base interface contacts 274 of a clamshell signal adapter 270 and the base clamshell test signal contacts 230. Details of the function of the interface will be detailed later in this disclosure.

Figure 3:
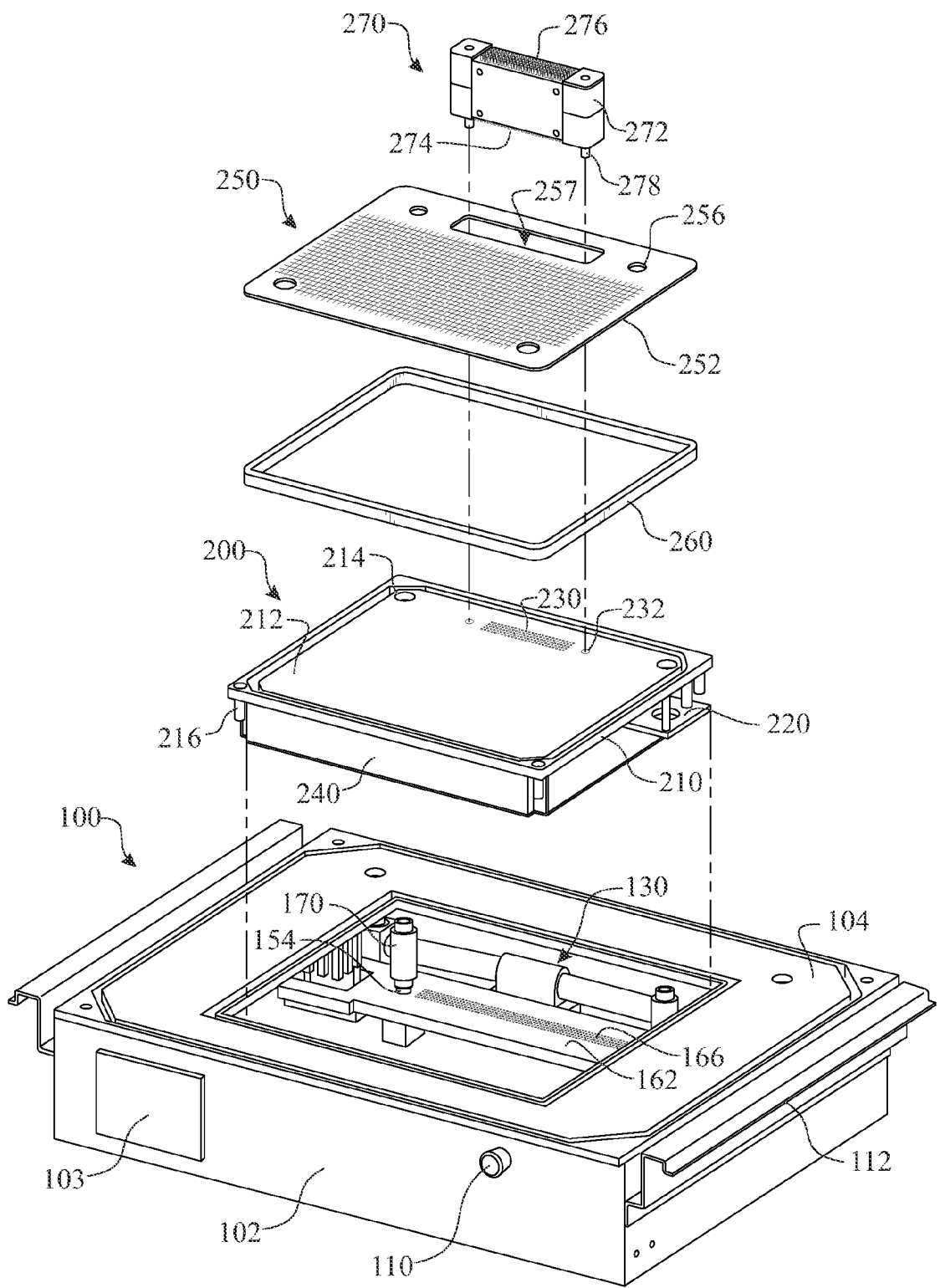
FIG. 3 presents an isometric exploded assembly view detailing exemplary additional test support components of the automated electronics circuit test system.

A printed circuit assembly test support member 250 is fabricated of a test support substrate 252; where details of the printed circuit assembly test support member 250 are best illustrated in FIG. 5. At least two printed circuit assembly registration pins 254 are assembled to the test support substrate 252, extending upward from an upper surface thereof. The printed circuit assembly registration pins 254 provide an alignment mechanism for receiving and aligning the printed circuit assembled to the printed circuit assembly test support member 250. At least two registration apertures 256 are cut through the test support substrate 252 providing a registration mechanism for aligning the printed circuit assembly test support member 250 with the automated test cassette 200. The registration apertures 256 are located in registration with and sized to slideably engage with the clamshell pin registration receptacle 280. A series of test probe apertures 253 are provided replicating the pattern of the automated test probe layout 213, each aperture being sized having a diameter slightly larger than the diameter of the respective test probe 213 providing sufficient clearance to allow the test probe 213 to slideably pass therethrough. Optional component clearances 258 can be strategically located to create clearances for components, leads, and other protrusions, which extend from a contact side of the printed circuit assembly. An optional clamshell interface aperture 257 can be cut through the test support substrate 252 allowing the clamshell signal adapter 270 to pass therethrough. The clamshell interface aperture 257 is included only for applications that utilize the clamshell signal adapter 270 as illustrated in FIG. 3.

A clamshell test head assembly 300 provides a seal for the vacuum system. Details of the clamshell test head assembly 300 are illustrated in FIG. 6. At least two clamshell registration pins 380 are assembled to an element of the clamshell test head assembly 300, such as a clamshell test support substrate 310, where the clamshell registration pin 380 are positioned in registration with each respective clamshell pin registration receptacle 280. The clamshell test support substrate 310 is assembled to the clamshell test frame 302 using a plurality of biasing members, such as a clamshell substrate biasing members 312. The clamshell test support substrate 310 is retained in an upward position by the clamshell substrate biasing members 312. A vacuum seal 360 is adhesively assembled to a rigid peripheral chamber 362, wherein the rigid peripheral chamber 362 is provided about a circumference of the clamshell test support substrate 310, as illustrated in FIGS. 7 through 10. The vacuum seal 360 provides a vacuum seal between the clamshell test support substrate 310 and the test support substrate 252. The rigid peripheral chamber 362 is fabricated of a rigid material and maintains a repeatable minimum distance between the clamshell test support substrate 310 and the test support substrate 252. This ensure against damaging the printed circuit assembly 400, any electronic components 404, test probes 313, contact-less test probe 314, pressure applicators 320 and the like. The vacuum force draws the clamshell test support substrate 310 downward against the upward biasing force generated by the clamshell substrate biasing members 312.

The clamshell test support substrate 310 is configured for testing a specific printed circuit assembly by drilling a pattern of a series of apertures for receiving a clamshell test probes 313 as illustrated in FIG. 6. The pattern mimics a test pattern applied to an upper surface of the printed circuit assembly. The test probes 313 can be selected from a variety of form factors, spring rates, compression distance, and the like. The specific form factor of each test probe 313 is determined for each individual test location. The test probes 313 are forcibly inserted into each respective drilled hole. Electrical communication between the clamshell test probes 313 and the automated test equipment platform 100 is provided by integrating a pattern of extended clamshell test signal contacts 330 into the clamshell test support substrate 310 and providing electrical signal communication between the clamshell test probes 313 and the extended clamshell test signal contacts 330. Each of the clamshell test probes 313 is in signal communication with a respective extended clamshell test signal contact 330 using a printed circuit board, wires, a combination thereof, and the like.

The clamshell signal adapter 270 provides an electrical interface between the automated test cassette 200 and the clamshell test head assembly 300. Details of the clamshell signal adapter 270 are best illustrated in FIGS. 3 and 7-10. The clamshell signal adapter 270 is fabricated having a series of double ended probes assembled to a signal adapter body 272. A first double ended probe end forms a base interface contact 274 and a second double ended probe end forms a clamshell interface contact 276. At least two adapter registration pins 278 are integrated to aid in registration of the clamshell signal adapter 270 with the automated test cassette 200. The adapter registration pin 278 can include a drilled cavity on an upper end thereof for receiving a registration pin (not shown) that can be integrated with the clamshell test support substrate 310 as desired. The pattern of extended clamshell test signal contacts 330 mimics the pattern of base clamshell test signal contacts 230. The pattern of extended clamshell test signal contacts 330 provides electrical communication between the clamshell test probes 313 and clamshell interface contacts 276 of the clamshell signal adapter 270. The clamshell signal adapter 270 is inserted between the test probe support substrate 210 of the automated test cassette 200 and the clamshell test support substrate 310 of the clamshell test head assembly 300, creating electrical communication between the base clamshell test signal contacts 230 and the extended clamshell test signal contacts 330.

Figure 15:
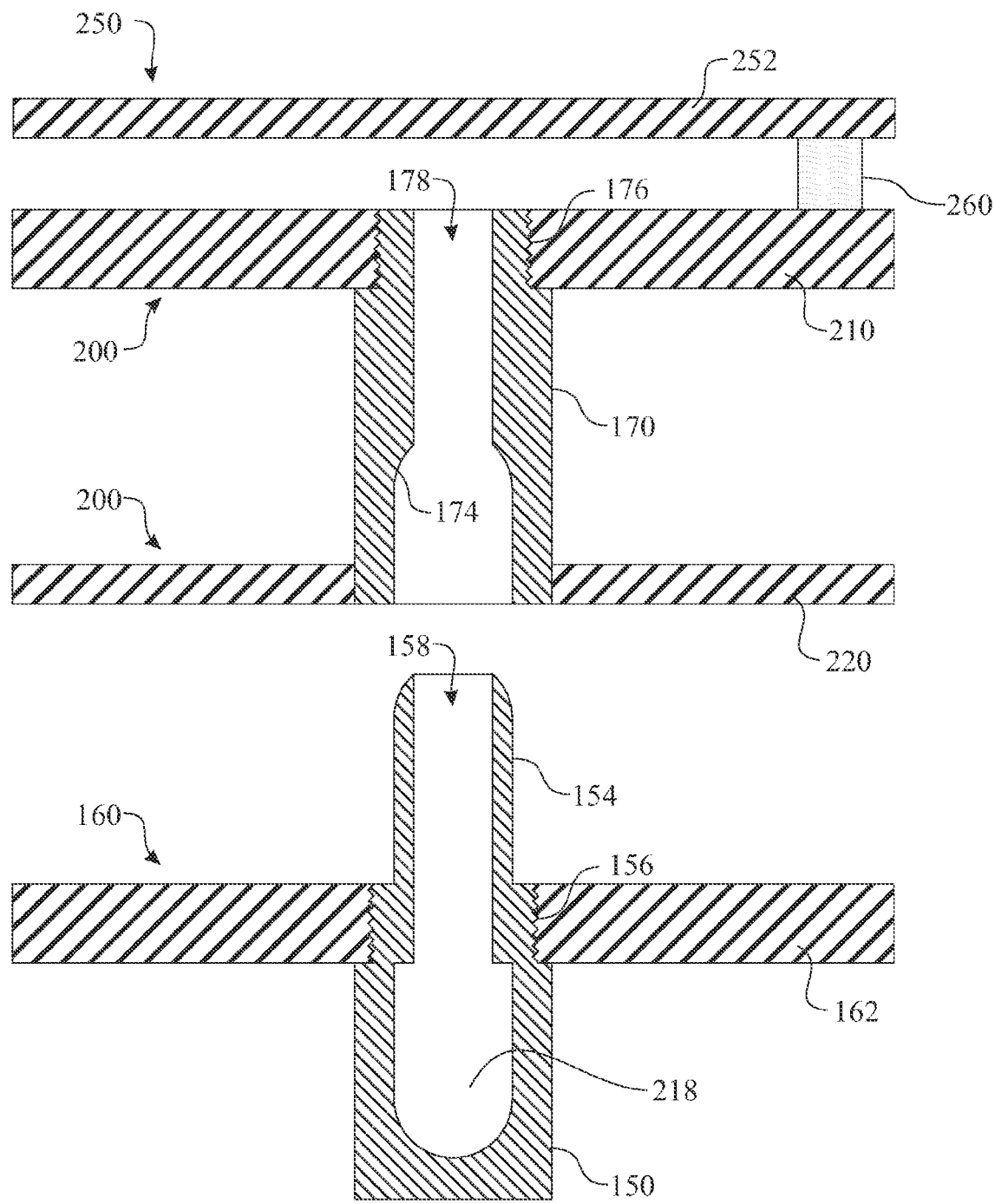
FIG. 15 presents a detailed sectioned elevation view of the registration interface having a vacuum system integrated therein.

The following describes the assembly and interface between the primary components and the functionality of the system. The automated test cassette 200 is assembled to the automated test equipment platform 100 by inserting the test probe support substrate 210 into a cavity provided within the platform cassette receiving chassis member 104. The cassette edge support and retention member 244 is inserted either below an edge of the platform cassette receiving chassis member 104 or into a receiving slot provided within the platform cassette receiving chassis member 104. The automated test cassette 200 is secured into location by sliding a cassette locking member 242 through a respective aperture provided through the vertical support member 240, as illustrated in FIGS. 9 and 10. The cassette alignment bushing 170 engages with the registration and vacuum supply coupler 154 providing both mechanical registration and vacuum communication therebetween. Details of the interface between the registration and vacuum supply coupler 154 and the cassette alignment bushing 170 are illustrated in the section view shown in FIG. 15. The registration and vacuum supply coupler 154 extends upward from the vacuum supply manifold assembly 150. In the exemplary embodiment, the common interface test probe contact base interface substrate 162 is assembled to the interface between the vacuum supply manifold assembly 150 and the registration and vacuum supply coupler 154, such as by a vacuum supply assembly interface 156. A vacuum port 158 is provided along a central longitudinal axis of the registration and vacuum supply coupler 154, providing a vacuum passage in communication between the removal assistance tab 218 of the vacuum supply manifold assembly 150 and a vacuum port 178 provided along a central longitudinal axis through the cassette alignment bushing 170. An engaging end of the registration and vacuum supply coupler 154 is shaped to direct and align the cassette alignment bushing 170 into proper position by engaging with a registration receptacle 174 within an engaging end of the cassette alignment bushing 170. The registration receptacle 174 is shaped to mechanically align to and fluidly seal with the registration and vacuum supply coupler 154. An upper region of the cassette alignment bushing 170 is mechanically secured to the test probe support substrate 210 such as by an alignment bushing assembly interface 176. The common interface test probe contact conveyance substrate 220 can optionally engage with a lower region of the cassette alignment bushing 170, increasing the rigidity of the overall assembly of the automated test cassette 200.

When the automated test cassette 200 is installed within the automated test equipment platform 100, the common interface test probe set 222 engage with the common interface test probe contacts 166 providing an electrical interface between the test probes 213 and the test controller. A series of common interface substrate mount 224 are integrated between the test probe support substrate 210 and common interface test probe contact conveyance substrate 220 providing stability and rigidity to the common interface test probe contact conveyance substrate 220. The automated test probe layout 213 provides electrical contact and communication with test points located in a bottom side of the printed circuit assembly 400. The printed circuit assembly test support member 250 is placed upon an upper surface of the automated test cassette 200, engaging the registration apertures 256 with each respective clamshell pin registration receptacle 280 as a means for aligning the printed circuit assembly test support member 250 with the automated test cassette 200. The alignment includes proper registration between the test probe apertures 253 and the automated test probe layout 213. It is understood that any form factor known by those skilled in the art can be utilized as a means for aligning the printed circuit assembly test support member 250 and the automated test cassette 200. The vacuum seal 260 provides a fluid seal between the test probe support substrate surface 212 and a lower surface of the printed circuit assembly test support member 250. The vacuum seal 260 is fabricated of a collapsible or pliant material such as foam, soft rubber, shaped plastic, and the like.

If the clamshell test head assembly 300 includes a test system, the optional clamshell signal adapter 270 is inserted through the optional clamshell interface aperture 257, placing the adapter registration pin 278 into each respective clamshell interface registration apertures 232, thus aligning the base interface contacts 274 with the base clamshell test signal contacts 230. As introduced above, the clamshell signal adapter 270 is fabricated having a series of double ended probes assembled to a signal adapter body 272. The first double ended probe end forms a base interface contact 274 and a second double ended probe end forms a clamshell interface contact 276. Each probe end is biased outward, and retracts within the probe when pressure is applied, thus providing a compliant interface to ensure proper contract during the testing process.

The printed circuit assembly 400 is placed upon the test support substrate 252 for testing, oriented with the bottom side contacting the test support substrate 252. A series of component clearances 258 are provided within the top surface of the test support substrate 252 providing a clearance for any projections, such as leads, components, and the like, extending from the bottom side of the printed circuit assembly 400. The PCB is aligned using any known alignment elements, such as a pair of printed circuit assembly registration pins 254 as illustrated in FIGS. 9 and 10. The registration aligns the automated test probe layout 213 with the respective test points located on the printed circuit assembly 400.

The clamshell test head assembly 300 is placed onto the test fixture, inserting the clamshell registration pin 380 into each respective clamshell pin registration receptacle 280.

Alternately, the clamshell test frame 302 can be assembled to a hinged frame member attached to the automated test equipment platform 100, preferably using a quick disconnect interface. The clamshell registration pin 380 slideably engages with a registration passage provided through the clamshell pin registration receptacle 280, allowing the clamshell registration pin 380 and thus the clamshell test support substrate 310 to adjust vertically when subjected to the vacuum force. A vacuum seal is provided between the clamshell test support substrate 310 and the test support substrate 252 by the vacuum seal 360. The vacuum seal 360 is fabricated of a collapsible or pliant material such as foam, soft rubber, shaped plastic, and the like. A rigid peripheral chamber 362 provides a rigid support to limit the vertical motion of the clamshell test support substrate 310. The clamshell test frame 302 is supported by a hinged member attached to the automated test equipment platform 100. The clamshell test support substrate 310 is assembled to the clamshell test frame 302 using a series of clamshell substrate biasing members 312. Each clamshell substrate biasing member 312 includes a vertical registration pin and a biasing member, such as a coil spring. The vacuum force draws the clamshell test support substrate 310 downward against an upward biasing force provided by the biasing members.

Figure 7:
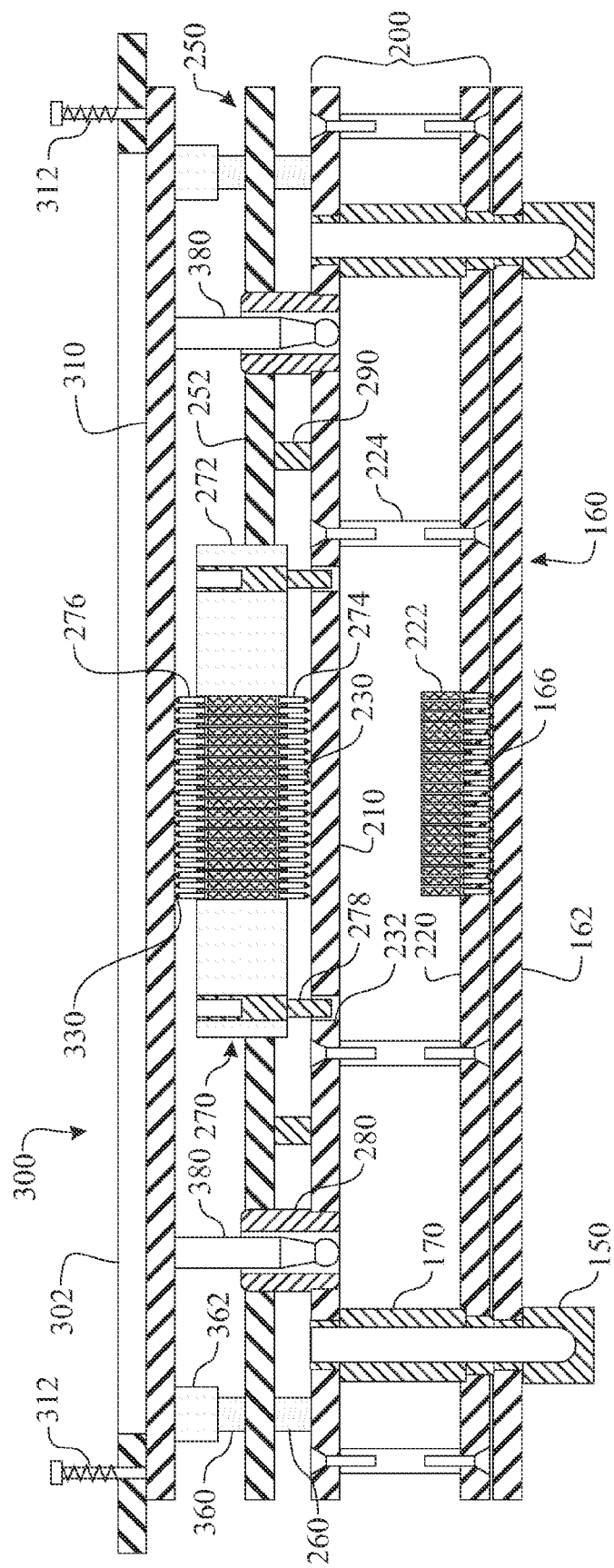
FIG. 7 presents a sectional elevation view of the automated electronics circuit test system taken along a lateral section line parallel to the rear registration components, wherein the system illustrated is in an inactive state.
Figure 8:
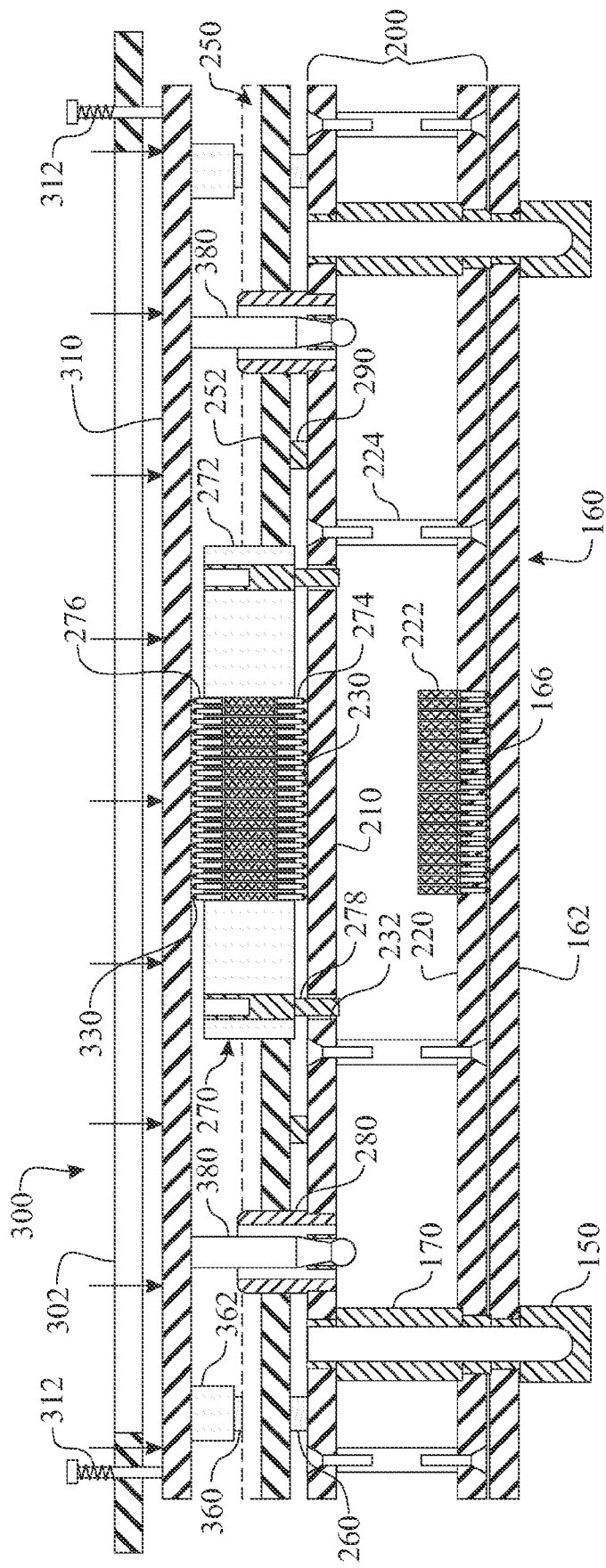
FIG. 8 presents a sectional elevation view of the automated electronics circuit test system of FIG. 7, wherein the system illustrated is in an active, testing state.

The test support substrate 252 is supported by the spring support member 292 and/or spring loaded support member 290 separated from the test probe support substrate surface 212, as illustrated in FIGS. 7 and 9. The test support substrate 252 is drawn towards the test probe support substrate surface 212 by applying a vacuum force through the vacuum supply manifold assembly 150, continuing through the cassette alignment bushings 170 and entering a gap provided between the test probe support substrate surface 212 and the printed circuit assembly test support member 250. The vacuum is activated by a signal sent to the vacuum control solenoids 146. The vacuum control solenoids 146 allow a vacuum flow to the registration and vacuum supply coupler 154, continuing through the cassette alignment bushing 170 and exiting into the gap. The vacuum then draws the test support substrate 252 towards the test probe support substrate surface 212, against the return force generated by the spring support member 292 and/or spring loaded support member 290, as illustrated in FIGS. 8 and 10. The plurality of vacuum draw stops 294 are spatially arranged upon the surface of the test probe support substrate surface 212 to maintain a proper distance between the test support substrate 252 and the test probe support substrate surface 212 during testing the printed circuit assembly 400. The supported distance ensures testing repeatability and the components of the test fixture are not damaged.

The vacuum also draws the clamshell test support substrate 310 towards the test support substrate 252. The vacuum is routed through the cassette alignment bushing 170 and continuing through the various apertures provided through printed circuit assembly test support member 250. The vacuum draws the clamshell test support substrate 310 towards the printed circuit assembly test support member 250. The vacuum seal 360 compresses as a result of the applied vacuum force. The rigid peripheral chamber 362 is rigid and maintains a desired distance between the clamshell test support substrate 310 and the printed circuit assembly test support member 250 when the system is placed in a fully enveloped vacuum condition. A plurality of pressure applicators 320 can be assembled to the clamshell test head assembly 300, extending downward from a lower surface of the clamshell test support substrate 310. The pressure applicators 320 apply a downward pressure to the printed circuit assembly 400, ensuring proper pressure is applied between the test probes 213 and the respective bottom side test contacts of the printed circuit assembly 400. The vacuum additionally generates a pressure applied between the test probes 313 and the respective PCB top side test points 412 (FIGS. 9 and 10) of the printed circuit assembly 400. The clamshell test head assembly 300 can additional include at least one optional contact-less test probe 314 extending downward from the lower surface of the clamshell test support substrate 310.

Certain printed circuit assemblies 400 require a two-stage test process. The system is configured to be adapted to a two stage testing process with the integration of the features of a two-stage test controlling mechanism 500 illustrated in FIGS. 11 through 14. Generally, the first stage test verifies certain power circuits to avoid permanently damaging the printed circuit assembly 400 during testing. The second stage test validates the complete functionality of the printed circuit assembly 400. The two-stage test controlling mechanism 500 includes a two-stage test control solenoid 502, which extends and retracts a two-stage test platform configuration member 504 attached by a two-stage test platform support member actuating arm 506. The two-stage test control solenoid 502 can be any operative mechanism that extends and retracts the actuator arm 506. The two-stage test platform configuration member 504 is attached at a distal end of the two-stage test platform support member actuating arm 506. An upper surface of the two-stage test platform configuration member 504 is in horizontal alignment with a cassette receiving member support edge 105 of the automated test equipment platform 100. At least one two-stage test platform test stage position support member 510 is provided extending downward from a lower surface of the printed circuit assembly test support member 250 and in registration with the two-stage test platform configuration member 504 when the two-stage test platform configuration member 504 is oriented in an extended state. A two-stage test platform support member clearance 512 is provided through the test probe support substrate surface 212, wherein the two-stage test platform support member clearance 512 is sized and located to align with the two-stage test platform test stage position support member 510. The two-stage test platform test stage position support member 510 can slide through the two-stage test platform support member clearance 512 when the two-stage test platform configuration member 504 is in a retracted state. The two-stage test platform test stage position support member 510 is supported, raising the printed circuit assembly test support member 250, when the two-stage test platform configuration member 504 is in an extended state.

Figure 12:
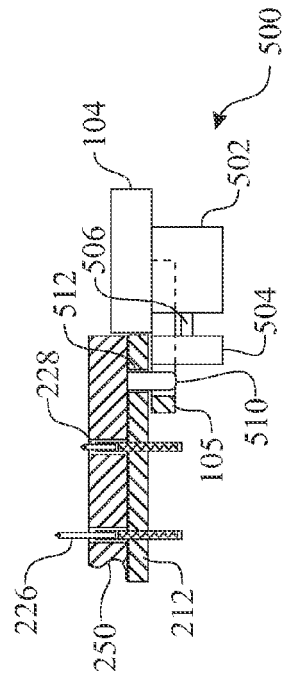
FIG. 12 presents a sectioned elevation view illustrating the exemplary two stage test control mechanism, wherein the mechanism is illustrated in a partial test, first stage configuration, the view taken along section 12-12 of FIG. 11.
Figure 13:
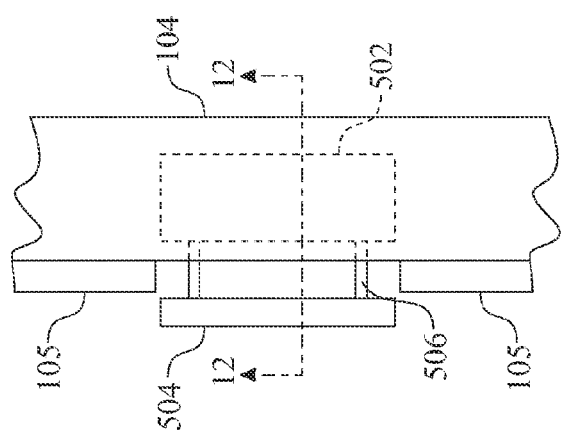
FIG. 13 presents a top view illustrating the exemplary two stage test control mechanism, wherein the mechanism is illustrated in a full test, second stage configuration.
Figure 14:
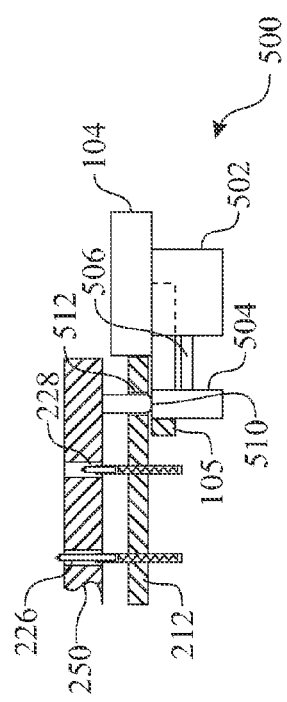
FIG. 14 presents a sectioned elevation view illustrating the exemplary two stage test control mechanism, wherein the mechanism is illustrated in a full test, second stage configuration, the view taken along section 14-14 of FIG. 13.

The automated test probe layout 213 includes two arrangements of test probes: a first stage series of test probes comprising a plurality of extended throw test probes 226 and a second stage series of test probes comprising a plurality of short throw test probes 228. When the two-stage test platform configuration member 504 is extended, the printed circuit assembly test support member 250 is elevated. The elevated configuration exposes the extended throw test probes 226, while insulating the short throw test probes 228 as illustrated in FIG. 12. The extended throw test probes 226 subsequently provide electrical contact with the respective PCB bottom side test points 410 to support a partial, first stage test process. When the two-stage test platform configuration member 504 is retracted, the two-stage test platform test stage position support member 510 continues passing through the two-stage test platform support member clearance 512, lowering the printed circuit assembly test support member 250 against the test probe support substrate surface 212 and exposing both the extended throw test probes 226 and the short throw test probes 228 as illustrated in FIG. 14. Both the extended throw test probes 226 and the short throw test probes 228 subsequently provide electrical contact with the respective PCB bottom side test points 410 to support a complete, second stage test process.

It is understood that alternate configurations can be provided to accomplish the two stage testing process. The two-stage control mechanism can be configured in the reverse, lowering the printed circuit assembly test support member 250 when the two-stage test platform configuration member 504 is extended and supporting the printed circuit assembly test support member 250 when the two-stage test platform configuration member 504 is retracted.

The test process is initiated by placing the printed circuit assembly 400 onto the printed circuit assembly test support member 250 of the automated test fixture. The operator then lowers the clamshell test head assembly 300 into a test position. The electrical test commences based upon a test fixture status sensor, an operator directive, and the like.

The above-described embodiments are merely exemplary illustrations of implementations set forth for a clear understanding of the principles of the invention. Many variations, combinations, modifications or equivalents may be substituted for elements thereof without departing from the scope of the invention. Therefore, it is intended that the invention not be limited to the particular embodiments disclosed as the best mode contemplated for carrying out this invention, but that the invention will include all the embodiments falling within the scope of the appended claims.

What is claimed is:

1. A method of preparing and utilizing an automated test station for testing a printed circuit assembly, the method comprising steps of:
   obtaining an automated test equipment platform, said automated test equipment platform comprising:
      a vacuum transfer manifold providing vacuum communication between a vacuum source and at least one vacuum port, and
      a common interface test probe contact base interface assembly comprising a series of common interface test probe contacts supported by a common interface test probe contact base interface substrate, said series of common interface test probe contacts defining a standard connectivity arrangement, each of said series of common interface test probe contacts being in signal communication with a test control circuit;
   installing an automated test cassette into said automated test equipment platform, said automated test cassette comprising:
      a test probe support substrate,
      a common interface test probe set, wherein each interface test probe of said common interface test probe set is located in registration with a respective common interface test probe contact of said series of common interface test probe contacts,
      an automated test probe layout comprising a series of test probes carried by said test probe support substrate, each test probe of said series of test probes in registration with a respective test location of said printed circuit assembly, each test probe of said series of test probes in signal communication with each respective each interface test probe of said common interface test probe set,
      a printed circuit assembly test support member comprising a series of apertures therethrough forming an automated test probe layout, wherein each of said series of apertures of said automated test probe layout are in registration with each respective test probe of said series of test probes and a printed circuit assembly registration and retention system,
      a vacuum seal attached to said test probe support substrate, said vacuum seal providing a pliant vacuum seal about a peripheral edge of a test probe support substrate surface of said test probe support substrate, and
      at least one cassette alignment bushing, wherein each of said at least one cassette alignment bushing includes a vacuum passageway, each of said at least one cassette alignment bushing is located in registration with said respective at least one vacuum port;
   engaging said each interface test probe of said common interface test probe set with each respective each common interface test probe contact of said series of common interface test probe contacts; and
   engaging said each cassette alignment bushing with each respective each respective at least one vacuum port providing vacuum communication between said vacuum transfer manifold and a vacuum chamber defined by a test probe support substrate surface of said test probe support substrate, a bottom surface of said printed circuit assembly test support member and said vacuum seal.

2. A method of preparing and utilizing an automated test station for testing a printed circuit assembly as recited in claim 1, the method further comprising steps of:
   placing said printed circuit assembly upon using said test probe support substrate surface printed circuit assembly registration and retention system for registration and retention thereof;
   initiating a vacuum, drawing a vacuum through said vacuum transfer manifold, and into said vacuum chamber, which draws said printed circuit assembly test support member towards said test probe support substrate surface, engaging each test probe of said series of test probes and said respective test location of said printed circuit assembly with one another; and
   completing at least one of an in circuit test and a functional test of said printed circuit assembly using said test control circuit in signal communication with said automated test probe layout.

3. A method of preparing and utilizing an automated test station for testing a printed circuit assembly as recited in claim 1, wherein said step of engaging each interface test probe of said common interface test probe set with each respective each common interface test probe contact of said series of common interface test probe contacts, and engaging said each cassette alignment bushing with each respective each respective at least one vacuum port providing vacuum communication between said vacuum transfer manifold and a vacuum chamber defined by a test probe support substrate surface of said test probe support substrate, a bottom surface of said printed circuit assembly test support member and said vacuum seal is accomplished in one single continuous motion.

4. A method of preparing and utilizing an automated test station for testing a printed circuit assembly as recited in claim 1, wherein said step of engaging each interface test probe of said common interface test probe set with each respective each common interface test probe contact of said series of common interface test probe contacts, and engaging said each cassette alignment bushing with each respective each respective at least one vacuum port providing vacuum communication between said vacuum transfer manifold and a vacuum chamber defined by a test probe support substrate surface of said test probe support substrate, a bottom surface of said printed circuit assembly test support member and said vacuum seal is accomplished in one single continuous motion and direction.

5. A method of preparing and utilizing an automated test station for testing a printed circuit assembly as recited in claim 1, the method further comprising a step of:
employing said vacuum as an element of said printed circuit assembly registration and retention system to retain said printed circuit assembly against said printed circuit assembly test support member.

6. A method of preparing and utilizing an automated test station for testing a printed circuit assembly as recited in claim 1, said method further comprising a step of:
employing a series of pressure applicators as a component of said printed circuit assembly registration and retention system to apply a retention force to an upper surface of to retain said printed circuit assembly against said printed circuit assembly test support member.

7. A method of preparing and utilizing an automated test station for testing a printed circuit assembly as recited in claim 1, the method further comprising a step of:
employing a clamshell test head assembly, said clamshell test head assembly comprising:
a series of clamshell test probes supported by a clamshell test support substrate, wherein each clamshell test probe of said clamshell test probes is in registration with a respective test location of said printed circuit assembly
a series of clamshell test signal contacts, wherein each clamshell test signal contact of said series of clamshell test signal contacts is in signal communication with a clamshell test probe of said series of clamshell test probes, and
providing signal communication between a series of base clamshell test signal contacts of said test probe support substrate and said series of clamshell test signal contacts.

8. A method of preparing and utilizing an automated test station for testing a printed circuit assembly as recited in claim 1, said common interface test probe set further comprises at least one extended throw test probe having an initial contact point at a first height and at least one short throw test probe having an initial contact point at a second height, wherein said first height is taller than said second height, and
the automated test equipment platform further comprising a retractable two-stage test platform configuration member, and
the printed circuit assembly test support member comprising a two-stage test platform test stage position support member;
the method further comprising a steps of:
placing said printed circuit assembly upon a printed circuit assembly of said printed circuit assembly test support member utilizing said printed circuit assembly registration and retention system for registration and retention thereof;
locating said two-stage test platform configuration member in a first position;
initiating a vacuum, drawing a vacuum through said vacuum transfer manifold, and into said vacuum chamber, which draws said printed circuit assembly test support member towards said test probe support substrate surface, to a position where said two-stage test platform test stage position support member engages with said two-stage test platform configuration member, engaging each extended throw test probe of said series of test probes and said respective test location of said printed circuit assembly with one another;
completing a first circuit test, where said circuit test is at least one of an in circuit test and a functional test of said printed circuit assembly using said test control circuit in signal communication with said automated test probe layout;
temporarily ceasing said drawn vacuum;
locating said two-stage test platform configuration member in a second position;
restoring said vacuum, drawing said vacuum through said vacuum transfer manifold, and into said vacuum chamber, which draws said printed circuit assembly test support member towards said test probe support substrate surface, to a position where said two-stage test platform test stage position support member is located at a second position respective to said two-stage test platform configuration member, additionally engaging each short throw test probe of said series of test probes and said respective test location of said printed circuit assembly with one another; and
completing a second circuit test, where said circuit test is at least one of an in circuit test and a functional test of said printed circuit assembly using said test control circuit in signal communication with said automated test probe layout.

9. A method of preparing and utilizing an automated test station for testing a printed circuit assembly, the method comprising steps of:
obtaining an automated test equipment platform, said automated test equipment platform comprising:
a vacuum transfer manifold providing vacuum communication between a vacuum source and at least one vacuum port, and
a common interface test probe contact base interface assembly comprising a series of common interface test probe contacts supported by a common interface test probe contact base interface substrate, said common interface test probe contacts having a generally horizontal arrangement, said series of common interface test probe contacts defining a standard connectivity arrangement, each of said series of common interface test probe contacts being in signal communication with a test control circuit;
installing an automated test cassette into said automated test equipment platform, said automated test cassette comprising:
a test probe support substrate,
a common interface test probe set, wherein each interface test probe of said common interface test probe set is arranged in a generally vertical orientation and is located in registration with a respective common interface test probe contact of said series of common interface test probe contacts,
an automated test probe layout comprising a series of test probes carried by said test probe support substrate, each test probe of said series of test probes in registration with a respective test location of said printed circuit assembly, each test probe of said series of test probes in signal communication with each respective each interface test probe of said common interface test probe set,
a printed circuit assembly test support member comprising a series of apertures therethrough forming an automated test probe layout, wherein each of said series of apertures of said automated test probe layout are in registration with each respective test probe of said series of test probes and a printed circuit assembly registration and retention system,
a vacuum seal attached to said test probe support substrate, said vacuum seal providing a pliant vacuum seal about a peripheral edge of said test probe support substrate surface, and
at least one cassette alignment bushing, wherein each of said at least one cassette alignment bushing includes a vacuum passageway, each of said at least one cassette alignment bushing is located in registration with said respective at least one vacuum port;
engaging said each interface test probe of said common interface test probe set with each respective each common interface test probe contact of said series of common interface test probe contacts by applying a vertical force therebetween; and
engaging said each cassette alignment bushing with each respective each respective at least one vacuum port providing vacuum communication between said vacuum transfer manifold and a vacuum chamber defined by a test probe support substrate surface of said test probe support substrate, a bottom surface of said printed circuit assembly test support member and said vacuum seal.

10. A method of preparing and utilizing an automated test station for testing a printed circuit assembly as recited in claim 9, the method further comprising steps of:
placing said printed circuit assembly upon using said test probe support substrate surface printed circuit assembly registration and retention system for registration and retention thereof;
initiating a vacuum, drawing a vacuum through said vacuum transfer manifold, and into said vacuum chamber, which draws said printed circuit assembly test support member towards said test probe support substrate surface, engaging each test probe of said series of test probes and said respective test location of said printed circuit assembly with one another; and
completing at least one of an in circuit test and a functional test of said printed circuit assembly using said test control circuit in signal communication with said automated test probe layout.

11. A method of preparing and utilizing an automated test station for testing a printed circuit assembly as recited in claim 9, wherein said step of engaging each interface test probe of said common interface test probe set with each respective each common interface test probe contact of said series of common interface test probe contacts, and engaging said each cassette alignment bushing with each respective each respective at least one vacuum port providing vacuum communication between said vacuum transfer manifold and a vacuum chamber defined by a test probe support substrate surface of said test probe support substrate, a bottom surface of said printed circuit assembly test support member and said vacuum seal is accomplished in one single continuous motion.

12. A method of preparing and utilizing an automated test station for testing a printed circuit assembly as recited in claim 9, wherein said step of engaging each interface test probe of said common interface test probe set with each respective each common interface test probe contact of said series of common interface test probe contacts, and engaging said each cassette alignment bushing with each respective each respective at least one vacuum port providing vacuum communication between said vacuum transfer manifold and a vacuum chamber defined by a test probe support substrate surface of said test probe support substrate, a bottom surface of said printed circuit assembly test support member and said vacuum seal is accomplished in one single continuous motion and direction.

13. A method of preparing and utilizing an automated test station for testing a printed circuit assembly as recited in claim 9, the method further comprising a step of:
employing said vacuum as an element of said printed circuit assembly registration and retention system to retain said printed circuit assembly against said printed circuit assembly test support member.

14. A method of preparing and utilizing an automated test station for testing a printed circuit assembly as recited in claim 9, the method further comprising a step of:
employing a series of pressure applicators as a component of said printed circuit assembly registration and retention system to apply a retention force to an upper surface of to retain said printed circuit assembly against said printed circuit assembly test support member.

15. A method of preparing and utilizing an automated test station for testing a printed circuit assembly as recited in claim 9, the method further comprising a step of:
employing a clamshell test head assembly, said clamshell test head assembly comprising:
a series of clamshell test probes supported by a clamshell test support substrate, wherein each clamshell test probe of said clamshell test probes is in registration with a respective test location of said printed circuit assembly
a series of clamshell test signal contacts, wherein each clamshell test signal contact of said series of clamshell test signal contacts is in signal communication with a clamshell test probe of said series of clamshell test probes, and
providing signal communication between a series of base clamshell test signal contacts of said test probe support substrate and said series of clamshell test signal contacts.

16. A method of preparing and utilizing an automated test station for testing a printed circuit assembly as recited in claim 9, said common interface test probe set further comprises at least one extended throw test probe having an initial contact point at a first height and at least one short throw test probe having an initial contact point at a second height, wherein said first height is taller than said second height, and
the automated test equipment platform further comprising a retractable two-stage test platform configuration member, and
the printed circuit assembly test support member comprising a two-stage test platform test stage position support member;
the method further comprising a steps of:
placing said printed circuit assembly upon a printed circuit assembly of said printed circuit assembly test support member utilizing said printed circuit assembly registration and retention system for registration and retention thereof;
locating said two-stage test platform configuration member in a first position;
initiating a vacuum, drawing a vacuum through said vacuum transfer manifold, and into said vacuum chamber, which draws said printed circuit assembly test support member towards said test probe support substrate surface, to a position where said two-stage test platform test stage position support member engages with said two-stage test platform configuration member, engaging each extended throw test probe of said series of test probes and said respective test location of said printed circuit assembly with one another;

completing a first circuit test, where said circuit test is at least one of an in circuit test and a functional test of said printed circuit assembly using said test control circuit in signal communication with said automated test probe layout;

temporarily ceasing said drawn vacuum;

locating said two-stage test platform configuration member in a second position;

restoring said vacuum, drawing said vacuum through said vacuum transfer manifold, and into said vacuum chamber, which draws said printed circuit assembly test support member towards said test probe support substrate surface, to a position where said two-stage test platform test stage position support member is located at a second position respective to said two-stage test platform configuration member, additionally engaging each short throw test probe of said series of test probes and said respective test location of said printed circuit assembly with one another; and completing a second circuit test, where said circuit test is at least one of an in circuit test and a functional test of said printed circuit assembly using said test control circuit in signal communication with said automated test probe layout.

17. A method of utilizing a utilizing an automated test station for testing a printed circuit assembly, the method comprising steps of:

locating an automated test station, said automated test station comprising:
a test control circuit, and
a retractable two-stage test platform configuration member;

obtaining an automated test cassette, said automated test cassette comprising:
a test probe support substrate,
an automated test probe layout comprising a series of test probes carried by said test probe support substrate, said common interface test probe set comprising at least one extended throw test probe having an initial contact point at a first height and located in registration with a respective first circuit test location of said printed circuit assembly and at least one short throw test probe having an initial contact point at a second height and located in registration with a respective second circuit test location of said printed circuit assembly, wherein said first height is taller than said second height,
a printed circuit assembly test support member comprising a series of apertures therethrough forming an automated test probe layout, wherein each of said series of apertures of said automated test probe layout are in registration with each respective test probe of said series of test probes and a printed circuit assembly registration and retention system,
a two-stage test platform test stage position support member carried by said printed circuit assembly test support member;

installing said automated test cassette into said automated test station and placing said series of test probes in signal communication with said test control circuit;

placing said printed circuit assembly upon a printed circuit assembly support surface of said printed circuit assembly test support member utilizing a printed circuit assembly registration and retention system for registration and retention integrated therewith;

locating said two-stage test platform configuration member in a first position;

positioning said two-stage test platform test stage at a first test location, wherein said position support member engages with said two-stage test platform configuration member, engaging each extended throw test probe of said series of test probes and said respective test location of said printed circuit assembly with one another;

completing a first circuit test, where said circuit test is at least one of an in circuit test and a functional test of said printed circuit assembly using said test control circuit in signal communication with said automated test probe layout;

locating said two-stage test platform configuration member in a second position;

positioning said two-stage test platform test stage at a second test location, wherein said two-stage test platform test stage position support member is located at a second position respective to said two-stage test platform configuration member, additionally engaging each short throw test probe of said series of test probes and said respective test location of said printed circuit assembly with one another; and completing a second circuit test, where said circuit test is at least one of an in circuit test and a functional test of said printed circuit assembly using said test control circuit in signal communication with said automated test probe layout.

18. A method of utilizing a utilizing an automated test station for testing a printed circuit assembly as reciting in claim 17, the method further comprising a step of:

utilizing a mechanical retention system to retain said printed circuit assembly upon a printed circuit assembly support surface of said printed circuit assembly test support member.

19. A method of utilizing a utilizing an automated test station for testing a printed circuit assembly as reciting in claim 17, the method further comprising steps of:

utilizing a vacuum to retain said printed circuit assembly upon a printed circuit assembly support surface of said printed circuit assembly test support member; and utilizing said vacuum to positioning said two-stage test platform test stage at each of said first test location and said second test location.

20. A method of utilizing a utilizing an automated test station for testing a printed circuit assembly as reciting in claim 17, the method further comprising steps of:

horizontally moving said two-stage test platform configuration member between said first position and said second position, and vertically moving said two-stage test platform test stage to each of said first test location and said second test location.

* * * * *